United States Patent [19]

Hawkins et al.

[11] Patent Number: 5,641,700
[45] Date of Patent: Jun. 24, 1997

[54] CHARGE COUPLED DEVICE WITH EDGE ALIGNED IMPLANTS AND ELECTRODES

[75] Inventors: Gilbert A. Hawkins, Mendon; David L. Losee, Fairport, both of N.Y.

[73] Assignee: Eastman Kodak Company, Rochester, N.Y.

[21] Appl. No.: 558,629

[22] Filed: Nov. 14, 1995

Related U.S. Application Data

[62] Division of Ser. No. 349,120, Dec. 2, 1994, Pat. No. 5,516,716.

[51] Int. Cl.[6] .................... H01L 21/265; H01L 21/70; H01L 27/00
[52] U.S. Cl. .................... 257/246; 257/248; 438/144
[58] Field of Search .................... 437/50, 53; 257/220, 257/221, 246, 247, 248

[56] References Cited

U.S. PATENT DOCUMENTS

| | | | |
|---|---|---|---|
| 3,651,349 | 3/1972 | Kahng et al. | 307/304 |
| 3,700,932 | 10/1972 | Kahng | 307/304 |
| 3,789,267 | 1/1974 | Krambeck et al. | 317/235 R |
| 3,911,560 | 10/1975 | Amelio et al. | 29/578 |
| 3,927,468 | 12/1975 | Anthony et al. | 29/578 |
| 4,035,906 | 7/1977 | Tasch et al. | 29/578 |
| 4,047,215 | 9/1977 | Frye et al. | 357/24 |
| 4,167,017 | 9/1979 | Tasch, Jr. et al. | 357/24 |
| 4,229,752 | 10/1980 | Hynecek | 357/24 |
| 4,613,402 | 9/1986 | Losee et al. | 156/643 |
| 4,746,622 | 5/1988 | Hawkins et al. | 437/26 |
| 4,789,648 | 12/1988 | Chow et al. | 437/225 |
| 4,910,569 | 3/1990 | Erhardt | 357/24 |
| 4,954,142 | 9/1990 | Carr et al. | 51/309 |
| 4,992,392 | 2/1991 | Nichols et al. | 437/53 |
| 5,362,662 | 11/1994 | Ando et al. | 437/50 |

OTHER PUBLICATIONS

Banghart et al., "Charge Transfer in the Presence of Potential Barriers, Compel —The International Journal for Computation and Mathematics in Electrical and Electronic Eng.," vol. 10, No. 4, pp. 205–213, Dec. 1991.

Primary Examiner—John Niebling
Assistant Examiner—Brian K. Dutton
Attorney, Agent, or Firm—Raymond L. Owens

[57] ABSTRACT

A fully self-aligned, charge coupled device (CCD) comprises a semiconductor substrate having implanted barrier and/or storage regions, an insulating dielectric layer disposed over the substrate, a first layer of closely spaced electrodes in self-alignment with at least one implant underneath the first electrodes, a second layer of closely spaced electrodes in self-alignment with the first electrodes and with at least one implant underneath the second electrodes also in self-alignment with the first electrodes. The process for fabricating the fully self-aligned CCD comprises the steps of first forming upon the semiconductive substrate, a uniform insulating dielectric layer; then forming a sacrificial layer upon the dielectric layer, the sacrificial layer patterned by removal of selected portions of the layer, at least one edge of the patterned sacrificial layer serving as a mask for ion implantation into the semiconductor substrate, the mask optionally comprising also photoresist; then forming in only those regions in which the sacrificial layer was removed, a first gate electrode; then removing the sacrificial layer, thereby exposing the sidewalls of the closely spaced first gate electrode, at least one of the sidewalls serving as a mask for a second ion implantation into the semiconductor substrate, the mask optionally comprising also photoresist; then forming a first oxide layer over the exposed surface of the first gate electrode; then depositing and patterning a second gate electrode layer to form a second gate electrode disposed between portions of the first gate electrode.

8 Claims, 9 Drawing Sheets

CHARGE COUPLED DEVICE WITH EDGE ALIGNED IMPLANTS AND ELECTRODES

This is a divisional of U.S. application Ser. No. 08/349,120, filed 02, Dec. 1994, now U.S. Pat. No. 5,516,716.

BACKGROUND OF THE INVENTION

FIELD OF THE INVENTION

This invention relates to a method of making a charge coupled device in which ion implants and gate electrodes are self-aligned by formation of the electrode over the region of ion implantation into the semiconductor substrate.

Charge coupled devices (hereinafter also referred to as CCD's) have found wide acceptance as shift registers for transporting charge in semiconductive substrates. A series of laterally spaced gate electrodes adjacent to but conductively separated from the semiconductive substrate and from one another are relied upon to transport minority carrier charge in discrete transfer steps within the semiconductive substrate. Each charge transfer step is achieved by proper potential biasing of the gate electrodes so that charge is attracted from one charge storage region to a next adjacent charge storage region in the semiconductive substrate.

It is essential that charge transfer be complete (high charge transfer efficiency) due to the large number, typically a thousand, of charge transfers employed in device operation.

Three phase CCD's, such as those described in Kahng et al., U.S. Pat. No. 3,700,932, are among the simplest to construct. The potential well in the substrate is uniform under each electrode and is controlled by the potential applied to the corresponding electrode. Charge transfer efficiency in three phase CCD's can be high because the potential in the semiconductive substrate varies monotonically from its value in the region under one electrode to that under an adjacent electrode when the two electrodes are biased for charge transfer, as is well known in the art. While three phase CCD's are simple in construction, the three phase clocking required for charge transport has been regarded as disadvantageous and the art has sought to construct a CCD capable of being driven by a two phase clock, in which case the CCD must be modified in construction to directionally bias charge transfer. An early two phase CCD, such as described in Kahng et al., U.S. Pat. No. 3,651,349, relied upon an insulator of stepped thickness under a single gate electrode to accomplish this modification, the step creating a region of lesser potential depth in the semiconductive substrate where the insulator was thinner and a region of greater potential depth where the insulator was thicker. Although the charge transfer efficiency of this device was high, the non-uniformity of the insulative layer was cumbersome to construct and required portions of the gate electrodes to lie in different planes, also complicating fabrication.

The art has therefore shown a preference for two phase CCD's having a simpler insulative layer and gate electrode construction relying on regions of increased impurity dopant concentration in the semiconductive substrate for directional biasing of charge transfer, as illustrated by Krambeck, U.S. Pat. No. 3,789,267. Such CCD's are illustrated by CCD 300 in FIG. 1 in which a semiconductive substrate 301 of a first conductivity type supports an insulative layer 303 on which interlaid sets of gate electrodes 305 and 307 connected to the phase 1 and phase 2 power sources, respectively, are positioned. As shown, regions 309, formed by ion implantation in the semiconductive substrate, exhibit a different net level of impurity doping than the surrounding portions of the semiconductive substrate. The regions can be of the first conductivity type as taught in U.S. Pat. No. 3,789,267 or can alternatively be of a second conductivity type, as taught by Tasch et al. in U.S. Pat. No. 4,035,906. The implants and the gates are located with respect to one another by benchmarks not identified and are not self-aligned, as illustrated for a typical misalignment in FIG. 1. The art has encountered difficulty constructing two phase CCD's with such impurity regions not self-aligned to the gates, because misalignment in either direction produces potential "wells" or potential "barriers" which trap charge during transfer, as is well known in the state of the art, discussed for example, by Banghart et al in COMPEL-The International Journal for Computation and Mathematics in Electrical and Electronic Engineering, Vol. 10, No. 4, 1991, pp. 205–215.

Virtual phase CCD's, as taught by Frye et al. in U.S. Pat. No. 4,047,215, Nichols et al. in U.S. Pat. No. 4,992,392, and by Hynecek in U.S. Pat. No. 4,229,752, have been employed to substantially accomplish self-alignment of the potential in the semiconductive substrate due to a direction biasing implant under the clocked electrode. In this technology, one set of physical electrodes is replaced by a heavily doped region near the surface of the semiconductive substrate. Such virtual phase electrodes are used to uniformly fix or pin the surface potential in a manner self-aligned to the adjacent physical gate electrode and to negate the effect of misalignment of direction biasing implants under the physical electrode. However, the amount of charge that can be transferred in virtual phase CCD's is limited due to the inability to clock the potential of the pinned region. Also, the process taught by U.S. Pat. No. 4,229,752 requires diffusion of the implanted dopant out of an insulative material, a process difficult to control and producing lateral spreading of implant profiles, an effect also well known in the art to itself produce "wells" and "barriers" to charge transfer. Such diffusion out of an insulative material is also required by a similar method of fabrication of two phase CCDs taught by Tasch et al. in U.S. Pat. No. 4,167,017.

Anthony et al. in U.S. Pat. No. 3,927,468, Losee et al. in U.S. Pat. No. 4,613,402, and Hawkins et al. in U.S. Pat. No. 4,746,622 disclose methods of fabricating self-aligned two phase CCD's in which the charge transfer direction biasing implants are fully self-aligned to phase 1 and phase 2 electrodes, both of which can be clocked independently. Although the implants taught are self-aligned, CCD's fabricated by these method suffer some degree of implant induced potential "wells" and potential "barriers" due to the inherent necessity in these methods of implanting at least one charge transfer direction biasing implant through the gate electrode. This implantation procedure requires a higher energy implantation in comparison to implantation through the insulative layer alone or directly into the semiconductive substrate, which is well known in the art to result in lateral spreading or straggle of the implant in the semiconductive substrate, such straggle in turn inducing potential "wells" and "barriers", also known in the art.

Amelio et al., in U.S. Pat. No. 3,911,560, teaches a method to construct self-aligned two phase CCD's in which the charge transfer direction biasing implants are fully self-aligned to electrode phases both of which are clocked and which does not require implantation of a charge transfer direction biasing implant to be through a gate electrode. Therefore, this method in principal avoids the occurrence of potential "wells" and "barriers" as well as enabling all phases to be clocked. However, the fabrication steps of connecting two adjacent gate electrodes electrically to form a single gate electrode, as taught by U.S. Pat. No. 3,911,560, is cumbersome.

SUMMARY OF THE INVENTION

We have discovered a process for accurately self-aligning the edge of charge transfer direction biasing implants in a CCD to all gate phases which process does not require implantation through the gate electrode layer and in which all gate phases can be clocked. This process is not predisposed to the production of transfer "wells" and "barriers" due to lateral implant straggle and is less sensitive to processing parameters than the prior art methods in which implants and electrodes are not self aligned. This process is advantageous in that it exhibits reduced charge transfer wells and barriers in comparison to prior art methods in which charge transfer direction biasing implants are required to penetrate the gate electrodes. Moreover, this process does not require the local connection of laterally adjacent gate electrodes.

More specifically, there is provided such a method of fabricating, at a region of a first conductivity type in a semiconductive substrate, a two phase CCD, the steps comprising:

(a) forming an insulative layer uniformly overlying the semiconductive layer;

(b) forming a sacrificial layer uniformly overlying the insulative layer whose thickness is such as to block ion implantation otherwise directed into the semiconductive layer;

(c) patterning the sacrificial layer by removal of the layer in closely spaced strips where it is desired to establish a series of first gate electrodes and self aligned charge transfer direction biasing implant regions;

(d) patterning in the form of closely spaced strips a photoresist layer on the patterned sacrificial layer at least one edge of which lies on the top of the strips of the sacrificial layer and one edge of which lies in the region where the sacrificial layer has been removed;

(e) implanting impurity ions of either the first or the second conductivity type into the conductive substrate the implant blocked in regions covered by either the sacrificial layer or the photoresist or both;

(f) removing the photoresist and depositing uniformly a first conductive electrode layer;

(g) planarizing the deposited electrode layer to the extent that those portions of the electrode layer initially residing on the sacrificial layer are entirely removed while those portions of the electrode layer residing on the insulative layer where the sacrificial layer has been removed are still substantially present thereby patterning the first electrode layer;

(h) removing the sacrificial layer, thereby exposing the sidewalls of the patterned first electrode layer;

(i) patterning in the form of closely spaced strips a photoresist layer on the patterned first electrode layer at least one edge of which lies on the top of the strips of the first electrode layer and one edge of which lies in the regions between the strips of the first electrode layer;

(j) implanting impurity ions of either the first or the second conductivity type into the conductive substrate the implant blocked in regions covered by the first electrode layer or the photoresist or both;

(k) oxidizing the surface of the exposed first electrode to establish an insulating layer surrounding the first electrode; and (l) depositing and patterning the second conductive electrode layer to form the second clocked phase.

Thus this invention advantageously features a method of obtaining self-aligned edges of charge transfer direction biasing implants to all gate phases in a two phase CCD that does not require implantation through the gate electrode layer.

It is a related advantageous feature that CCD's constructed in accordance with this invention have substantially reduced charge transfer "wells" and "barriers" produced by misalignments.

It is a related advantageous feature that CCD's constructed in accordance with this invention have substantially reduced charge transfer "wells" and "barriers" produced by lateral spread of charge transfer direction biasing implants. As a result, a method is provided for making CCD's with increased charge transfer efficiency.

This method is advantageous in that it also allows for the clocking of all gate electrodes.

Another advantage of this method is that the process does not require the connection of laterally adjacent gate electrodes.

Another advantage is that a method is provided which enables the use of charge transfer direction biasing implants of either conductivity type.

The method is particularly suited to the construction of two phase CCD's but can also be applied equally to the fabrication of other types of CCD structures benefiting from self-alignment of electrodes and implants and from implants of low lateral spread, such as charge transfer speed-up implants well known in the art of three and four phase CCD's and in charge transfer into and out of CCD shift registers.

Other advantageous features will become apparent upon reference to the following "Description of the Preferred Embodiment", read in light of the attached drawings.

DESCRIPTION OF THE PREFERRED EMBODIMENTS

Figure 1:
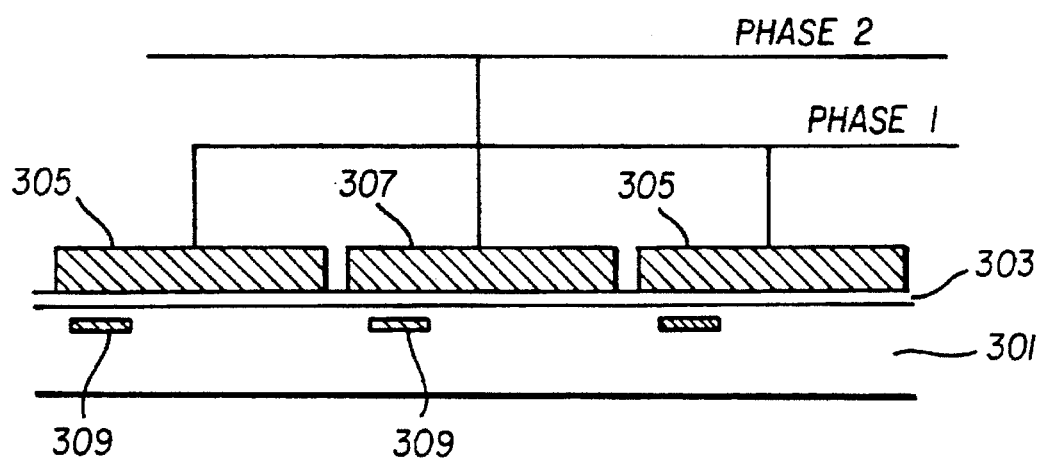
FIG. 1 is a fragmentary, partially schematic vertical section view through a semiconductor device, illustrating a prior art construction.

Much of the following discussion concerns the construction of a two-phase CCD using polysilicon electrodes. While particularly suited to this device, the present invention is in addition applicable to any device in which an implant is desired formed below and self-aligned to a conductive electrode without the necessity of implantation through the electrode or any part of the electrode. The term "self-aligned" is taken to mean that accurate alignment of two physical structures is not dependent on accurate alignment of a mask. For example, the invention is useful in any situation where the implanted dopant must be self-aligned to the edge of a gate, such as in making CCD's with lateral overflow drains, or to the situation in which a first implant is self-aligned to the edge of a second implant, the extent of which is in the direction opposite that of the first implant, either with or without the final presence of an electrode, as in the case of self-alignment of photodiode and CCD structures. The term "polysilicon electrode" in the following discussion is taken to mean a conductive electrode material formed from polysilicon which may be doped to enhance its conductivity either during or after deposition by impurity ions such as phosphorus boron, or arsenic, as is commonly practiced in the art.

The proper edge alignment of the implanted portions and the conductive electrodes is achieved by the use of part of the masking material serving to define the ion implant as the defining edge for formation of the conductive electrode and by planarizing the conductive electrodes so the material may be removed.

The process of the present invention for constructing two phase CCD's exhibiting accurate alignment of implanted dopants and conductive electrodes is illustrated by reference to FIGS. 2A through 2L A region 10 of a first conductivity type in a semiconductive substrate, most preferably P type single crystal silicon, having a buried n-type channel (not shown) to contain minority carrier charge (electrons), has overall a first insulative layer 14, preferable a grown layer of silicon dioxide (oxide), and a second insulating layer 16, preferably of deposited silicon nitride (nitride), the insulating layers together comprising a bilayer gate dielectric 20. Preferably, the thickness of bilayer 20 is in the range 100 to 500 Angstrom units, the thickness of the oxide being greater than that of the nitride as is known in the state of the art of dielectric insulators. Deposited on gate dielectric 20 is sacrificial layer 30, preferably oxide, whose properties are such that nearly vertical walls can be formed by dry etching, the pattern being defined by conventional photoresist (not shown), and having a thickness sufficient to block ion implants otherwise directed into the silicon substrate, and also at least as thick as the desired thickness of the conductive electrodes later to be formed. Such thicknesses preferably lie in the range of from several tenths of a micron to several microns, the thicker values appropriate for very high energy implants, for example implants in the range of from 200 KeV to 2 MeV.

Figure 2A:
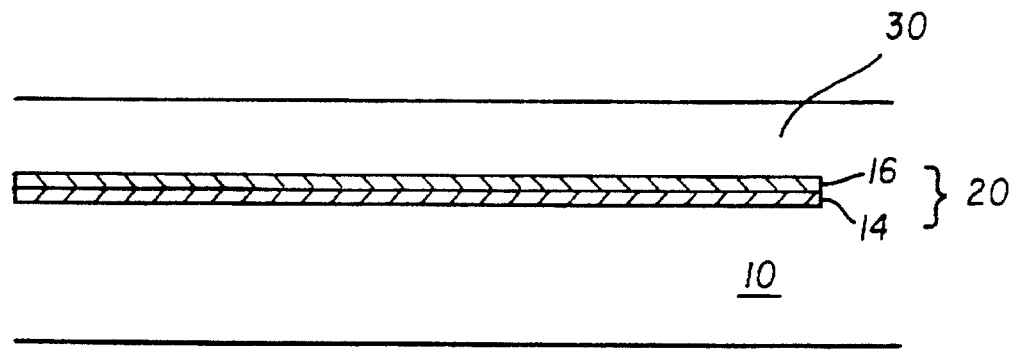
FIGS. 2A through 2K are partially schematic vertical section views through a semiconductor device illustrating respectively the successive steps of one embodiment of this invention.
Figure 2B:
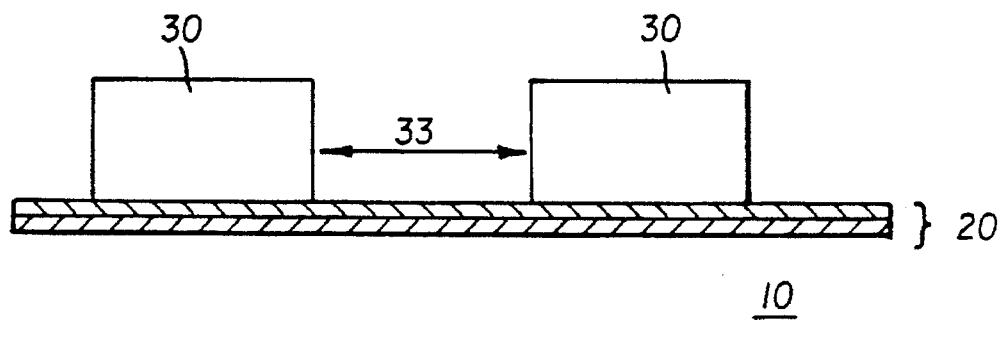

FIG. 2B shows the structure of FIG. 2A after definition of sacrificial layer 30 to form closely spaced strips by dry etching, for example, by anisotropic reactive ion etching, know in the art to form vertical sidewalls. The photoresist has been removed in FIG. 2B. The left wall of the resulting pedestals will be utilized in accordance with this invention to define the edges of the charge transfer direction biasing implants and to define the location of the right sides of the subsequently formed conductive electrode strips, as will be described. The ability to make these walls vertical is thus a key feature in the present invention.

Figure 2C:
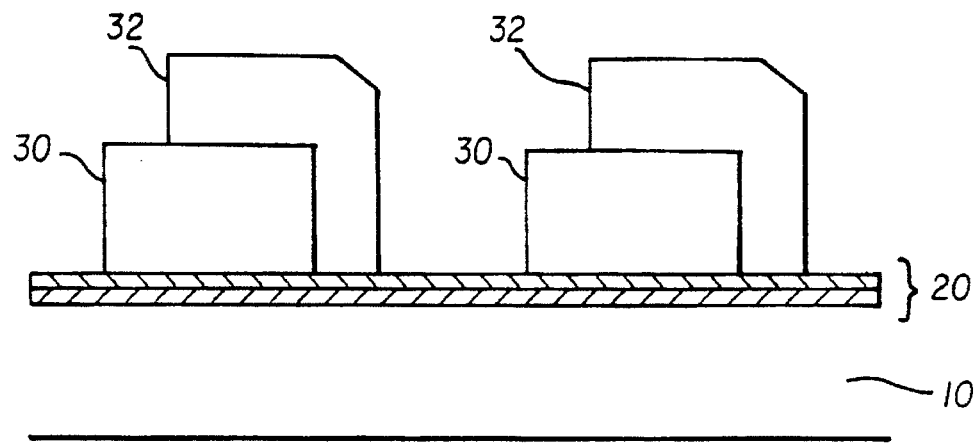
Figure 2D:
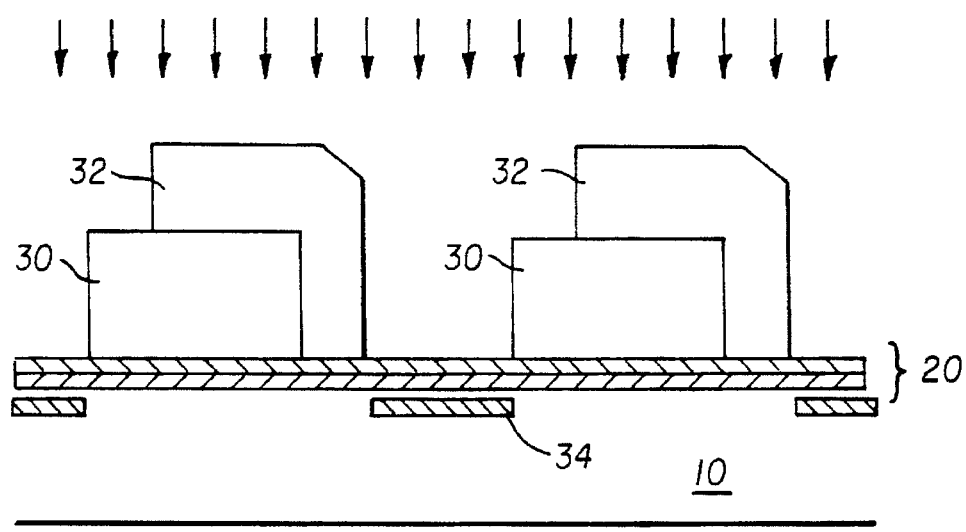
Figure 2E:
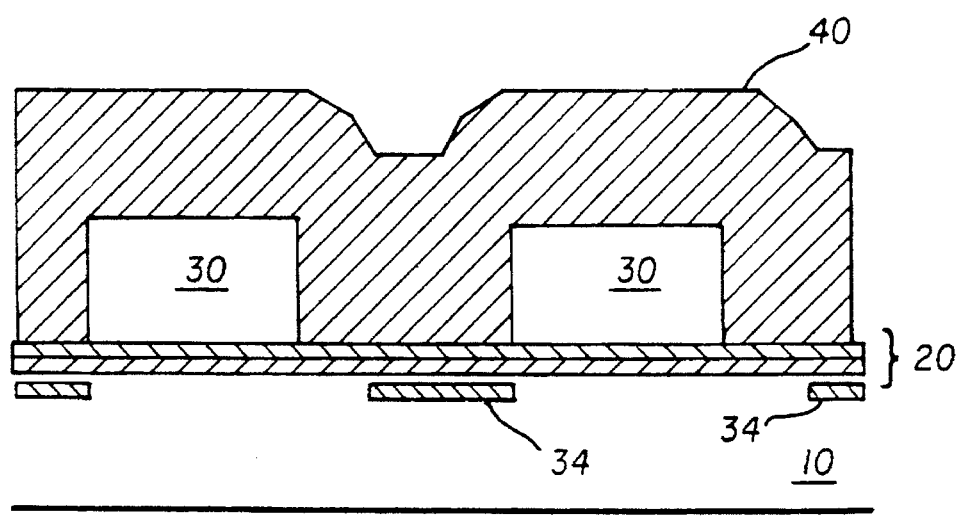

FIG. 2C shows one preferred embodiment for definition of the region to receive an implant of the second conductivity type, preferably Arsenic, to form the storage region of the first CCD phase. Photoresist layer 32 is patterned by means of conventional lithography so that the point of termination of one side is on sacrificial layer 30 while the other side lies in the region 33, FIG. 2B, where the sacrificial layer has been removed. The thickness of the photoresist is chosen to be sufficient to prevent penetration of the subsequent ion implantation, preferably 1.0 to 3.0 microns. The precise termination point of the photoresist layer within region 33 as well as the slope of the photoresist sidewall in not critical to the charge transfer efficiency of the CCD as is well known in the art because this region is laterally removed from the edge of the conductive electrodes. The position of the left edge of the photoresist, which terminates on sacrificial layer 30, is immaterial, since the sacrificial layer alone is chosen to be sufficiently thick to block the implant. The step of implantation is indicated in FIG. 2D by the row of arrows. The location 34 of the As implant is shown in FIG. 2D. The spreading of the implant laterally in accordance with this invention is small in comparison to the prior art taught in accordance with U.S. Pat. Nos. 3,927,468; 4,613,402; and 4,746,622, because the energy required to penetrate the dielectric layer 20 is much less than that required to penetrate the conductive electrodes in addition to the dielectric layers taught in the above two patents.

At this stage, no conductive layers have been formed and only one of the two charge transfer direction biasing implants has been performed. Formation of the first conductive gate electrode is next accomplished in a preferred embodiment shown in FIG. 2E, in which a conformal layer of the first conductive electrode, preferably heavily doped polysilicon, is deposited, preferably by chemical vapor deposition, as is common in the art. The thickness of this layer is chosen to be sufficient to block subsequent implants, which in the preferred embodiment are advantageously chosen to be identical to the first charge transfer direction biasing implant. The preferred range of polysilicon thickness is typically from 0.1 micron to 1.0 micron for the preferred case of arsenic implantation. However, in some applications of the present invention, a later need to block more penetrating ion implantations, used for example to establish photodiodes along side the CCD shift registers, may dictate the use of thicker first conductive electrodes.

Figure 2F:
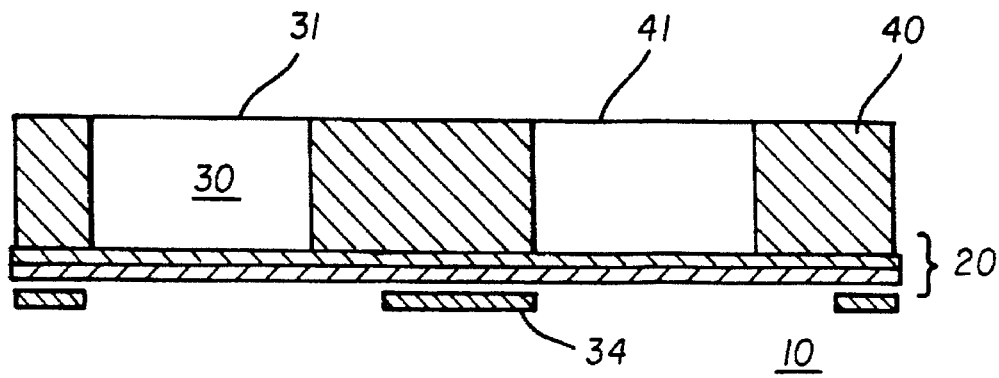
Figure 2G:
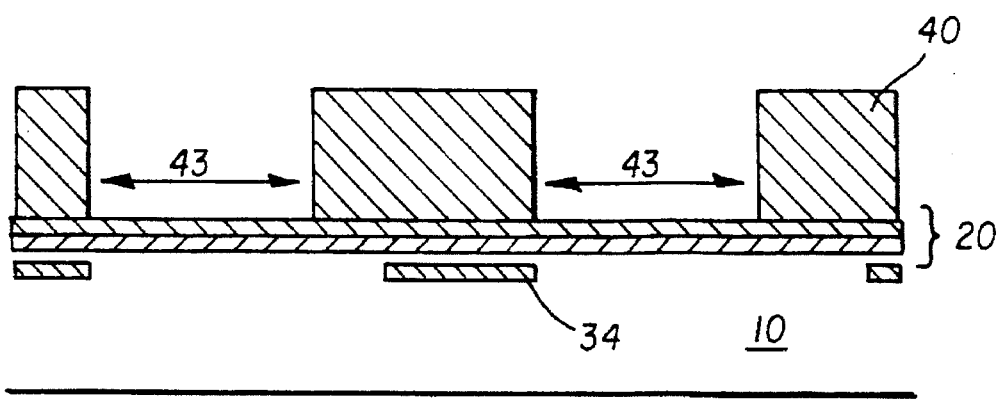

It now remains to pattern conductive electrode layer 40 in order to establish regions in which the electrodes are desired not to control the potential in substrate 10, and to establish, in accordance with the present invention, edge alignment of the resulting patterned electrode with the fight edge of implant 34. This is advantageously accomplished in one preferred embodiment by subjecting the surface of the wafer of FIG. 2E to chemical mechanical polishing (CMP), as currently practiced in the semiconductor art for the planarization of metals and dielectrics and as taught in numerous U.S. Patents such as that by Chow et al., U.S. Pat. No. 4,789,648 and Carr et al., U.S. Pat. No. 4,954,142. This procedure, while being only one of many possible planarizing procedures, is advantageous in its ability to render the surface extraordinarily smooth, improving the ability to subsequently grow insulative oxide layers on remaining regions of the first conductive electrodes. It is advantageous to planarize this layer in order to remove it entirely from over sacrificial layer 30, thereby defining isolated strips of the conductive electrode as well as providing a vertical edge of the conductive electrode material in contact with the vertical sidewall of sacrificial layer 30 having no overlying or re-entrant profile above the sidewall which would interfere with the alignment of subsequent ion implantations. The slurry for this procedure is preferentially fumed silica in KOH at PH of about 10 so that the removal rate of polysilicon is only somewhat larger that oxide in order that the final polished surface comprises rectangular cross sections with nearly flat upper surfaces, as shown in FIG. 2F. Many other slurries are possible as practiced currently in the industry. A critical feature of the current invention is preservation of the integrity after planarization of the gate dielectric directly underneath the first conductive electrode, not generally required or obtained in the CCD art. The results of CMP are shown in FIG. 2F. The surface 31 of sacrificial layer 30 and the surface 41 of first conductive layer 40 are preferably coplanar to within 100 to 1000 Angstroms, although the process is tolerant of lesser coplanarity.

At this stage of the process the edge of the first conductive electrode is self-aligned to charge transfer direction biasing implant 34, as prescribed in accordance with this invention, however, the ability to self-align a second implant is available only upon removable of sacrificial layer 30. Removal of this layer, depicted in FIG. 2G, and the strictly vertical definition of the thus exposed first conductive layer sidewall, effectively transfers the alignment benchmark from the edge of sacrificial layer 30 to the edge of layer 40, rendering now possible a subsequent implant to be self-aligned to either the left or the right edge of the open region 43 between strips of first conductive electrodes 40.

Figure 2H:
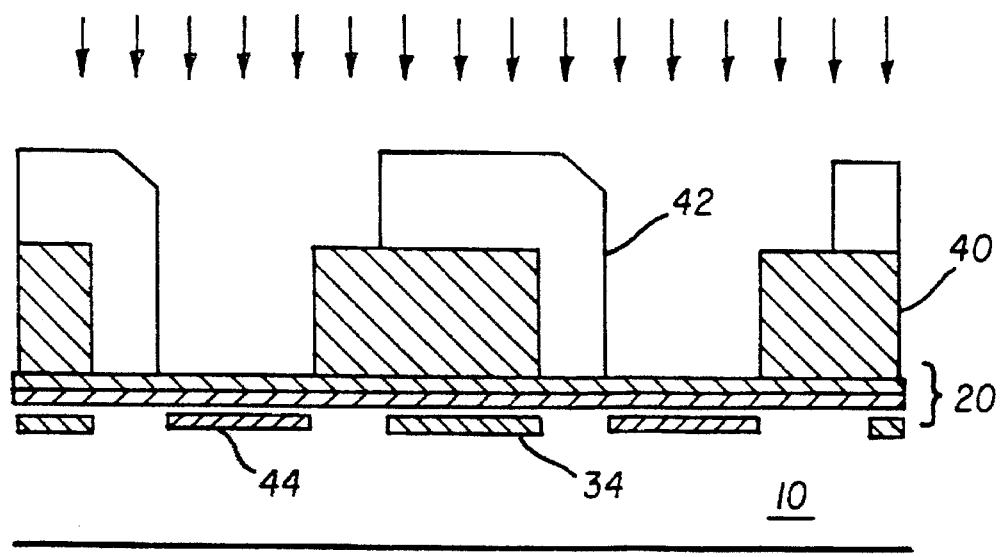

In the particular embodiment described, it is required that alignment of a second charge transfer direction biasing implant be made at the left sides of the conductive electrodes 40, extending over only a portion of opening 43, thus necessitating definition of a photoresist mask in addition to the mask provided by layer 40, similar to the steps discussed in association with FIG. 2C and shown in FIG. 2H. Photoresist layer 42 masks a portion of region 43 from biasing implant 44, here preferably also Arsenic of dose and energy identical to that of biasing implant 34. It is advantageous in this embodiment that these implants be identical and that they penetrate identical very thin dielectric layer 20, each in the same manner, so that neither experiences appreciable lateral straggle.

Figure 2I:
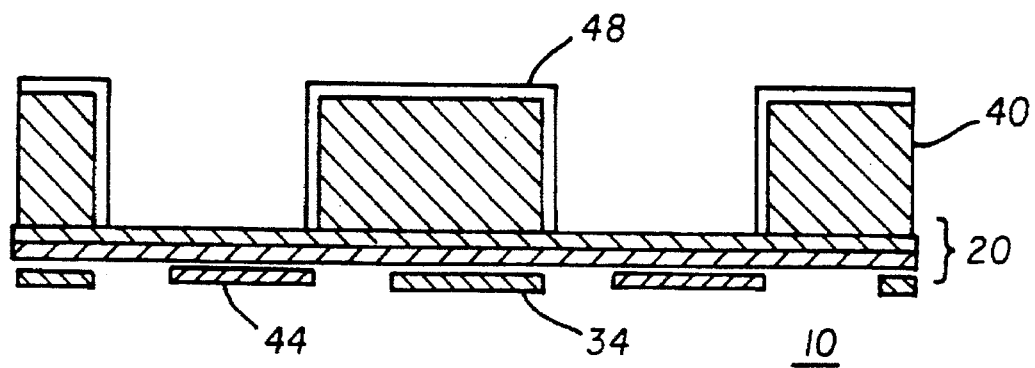

FIG. 2I shows the device cross-section following subsequent removal of resist 42 and formation of dielectric isolation layer 48, preferably grown silicon dioxide. In one preferred embodiment, this layer is grown at low temperatures to ensure minimal dopant diffusion. In the case of the preferred bias implant being arsenic, diffusion is essentially negligible for temperatures below 900° C. The oxide is grown thin, typically in the range of from 200 to 1000 Angstroms, in order that the first and second conductive gate electrodes be closely spaced. It is advantageous in this method that the grown oxide extends into and out of the surfaces of the polysilicon electrodes in similar thicknesses, maintaining thereby a central location of the implant edge with respect to the center of the isolation layer. It is also advantageous that the thickness of this oxide can be adjusted and that the order of its growth with respect to ion implantation can be altered in order to precisely establish the placement of the implant with respect to the edge of the conductive electrode.

At this stage, the electrode structure of this invention is similar to electrode structures taught in previous art, for example by Losee et al in U.S. Pat. No. 4,613,402, although the method of arriving at this structure has been very different; the method of the present invention relying in particular upon deposition of the first conductive electrode layer over a patterned sacrificial layer which served as an implant mask. The degree of lateral spread of the dopant according to the present invention is by comparison much reduced on account of the thickness of the layers which need be penetrated by the dopant and by the number of thermal steps involved in respective processes, and by the fact that the type of dopant preferred in this embodiment, Arsenic, which diffuses slowly, is difficult to achieve in the technology taught by U.S. Pat. No. 4,613,402 without the aid of high energy implantation, which adds cost and complexity to the process.

It is now desired to form a second set of electrodes, self-aligned both to the second charge transfer directional bias implant and to the first set of conductive electrodes. Here, these alignments are achieved automatically due to the fact that the right edge of the second charge transfer direction biasing implant can be self-aligned to the left edge of the first conductive electrode strip, which in turn is automatically self-aligned to the right edge of the second conductive electrode. The second conductive electrode strips are self-aligned to the first conductive electrodes because their active area is shielded by the regions of overlap.

Figure 2J:
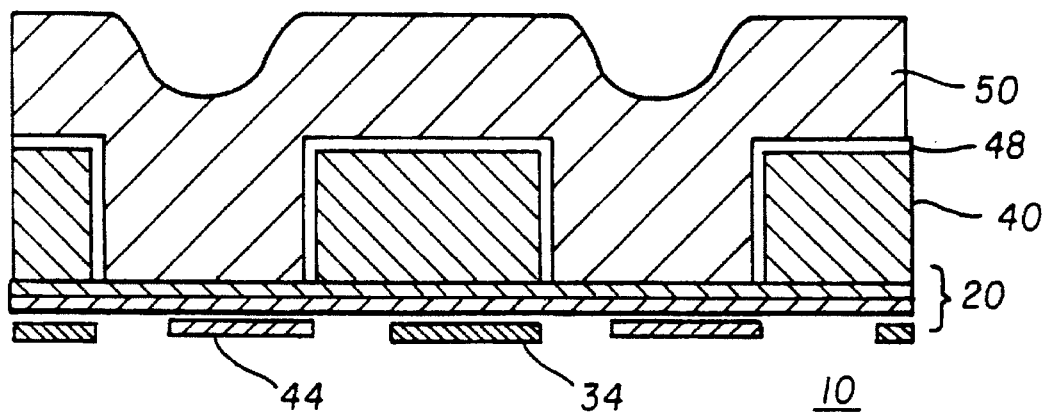

The procedure for completion of the CCD in the preferred embodiment here is known in the art, namely deposition and patterning of a second layer of conductive material, preferably doped polysilicon. The properties of this second conductive layer are preferably optimized with respect to the remaining process constraints, such as degree of vertical topography which can be tolerated, and the possible use of the second conductive electrode as an implant mask for implantations not directly related to the making of the CCD shift register, all of which constraints may influence the thickness and doping required of the second conductive layer. In the preferred embodiment formation at the second set of conductive strips is shown in FIG. 2J, in which polysilicon of thickness similar to that deposited for the first conductive electrode structure is deposited preferably by chemical vapor deposition.

Figure 2K:
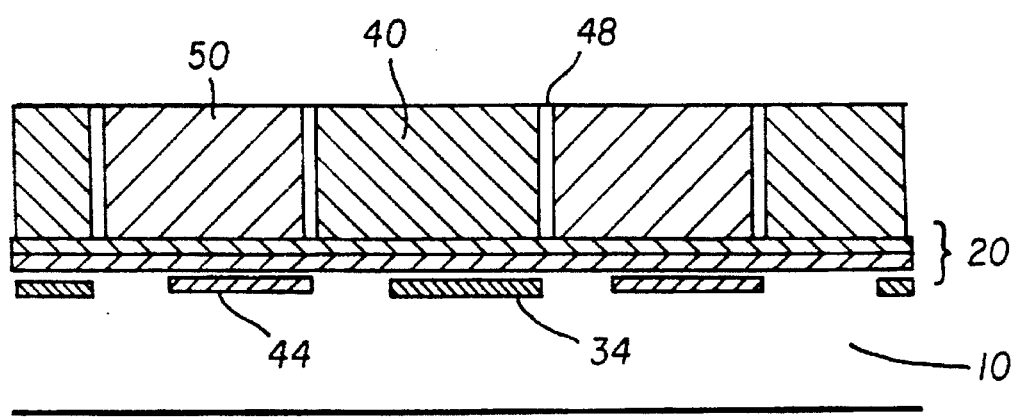

After deposition of the second conductive electrode layer 50, patterning shown in FIG. 2K is achieved in the preferred embodiment by chemical mechanical polishing, preferably rendering the surfaces of the first and second conductive layers coplanar to within at least 100 to 1000 Angstroms, a desired feature for subsequent semiconductor device processing.

At this point the device is substantially complete, save for conventional passivation, contact openings, and conductive metal electrode deposition and patterning steps, which are unrelated and not specific to the scope of this invention, but which need be performed to complete the device in the same manner as in the completion of any two phase CCD.

It is to be appreciated that while the preferred embodiment has been described, there are many variants of the method of this invention applicable to a variety of device materials which may be employed within the scope of this invention to optimize device functionality in specific applications.

The material comprising the insulative layer 48 while preferably a grown oxide may also be a deposited material, for example a nitride or a deposited oxide, or a bilayer of oxide and nitride, which reduces thermal processing.

The material comprising the second conductive electrode while preferably doped polysilicon can in some applications be advantageously chosen to be a transparent conductor, such as indium tin oxide or tin oxide, known in the art to provide better transmission of light to the substrate, as is appropriate when the CCD is photo active, as in the case of a full frame image sensor.

Figure 3:
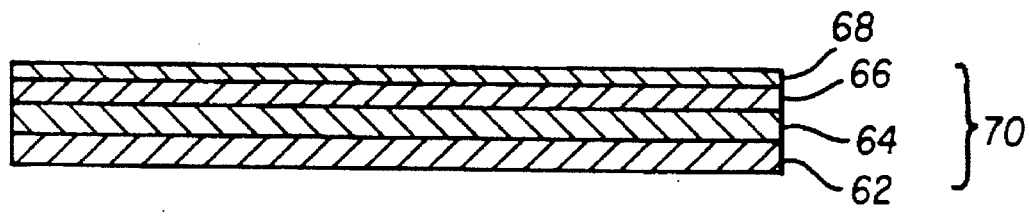
FIGS. 3 is a schematic vertical section view through a semiconductor device illustrating steps of another embodiments of this invention.

The materials comprising dielectric layer 20 in FIG. 2A may also be comprised of other dielectric layers. FIG. 3 depicts a more complex dielectric material layer 70 on semiconductor substrate 60 comprised of a 4 layer stack of oxide layer 62, nitride layer 64, oxide layer 66, and nitride layer 68, chosen to reduce the effects of charge injection from the conductive electrodes into the dielectric layers as is known in the art. Preferred in this embodiment are layer thicknesses for each of the bottom three layers of from 100 to 300 Angstroms each and less than 50 angstroms for the top layer, the bottom layer having been thermally grown, the middle layers deposited by standard techniques of chemical vapor deposition, and the final top layer of thickness less than 50 Angstroms, the top layer having been formed by high temperature nitrization of the under lying top oxide layer in the presence of Nh3 gas, as is common practice in the manufacture of semiconductor dielectrics.

A related material choice for a more complex dielectric material layer analogous to layers 20 of FIG. 2A is comprised of a 3 layer stack of oxide, nitride, and oxide. Preferred in this embodiment are layer thicknesses for each of the three layers of from 100 to 300 Angstroms each, the bottom layer having been thermally grown, the middle and top layers having been deposited by standard techniques of chemical vapor deposition. In the preferred embodiment using this choice of materials, the material preferred for the sacrificial layer 30 is nitride, deposited for example by chemical vapor deposition, to enable sacrificial layer 30 to be etched without etching the top layer of the dielectric layer 20. In accordance with this invention, the material comprising sacrificial layer 30 must be chosen such that it be etchable in a highly anisotropic etch to form vertical sidewalls without the etch penetrating the upper layer of the dielectric material, that the material be sufficiently thick as to block subsequent ion implants, and that material be removable without destruction of the top layer of the dielectric layer 20 nor the first conductive electrodes. Related materials also satisfying these criteria are tin oxide and indium tin oxide.

Another preferred choice for the dielectric layer 20 is thermally grown oxide, preferably in the thickness range 100 to 500 Angstroms. In the preferred embodiment using this choice of materials, the material preferred for the sacrificial layer 30 is nitride.

It is also to be appreciated that while the preferred embodiment has been described with respect to charge transfer along a two phase CCD shift register, this invention is applicable to a variety of device structures in which one or more implants are desired formed below and self-aligned to a conductive electrode without the necessity of implantation through the electrode or any part of the electrode.

Figure 4A:
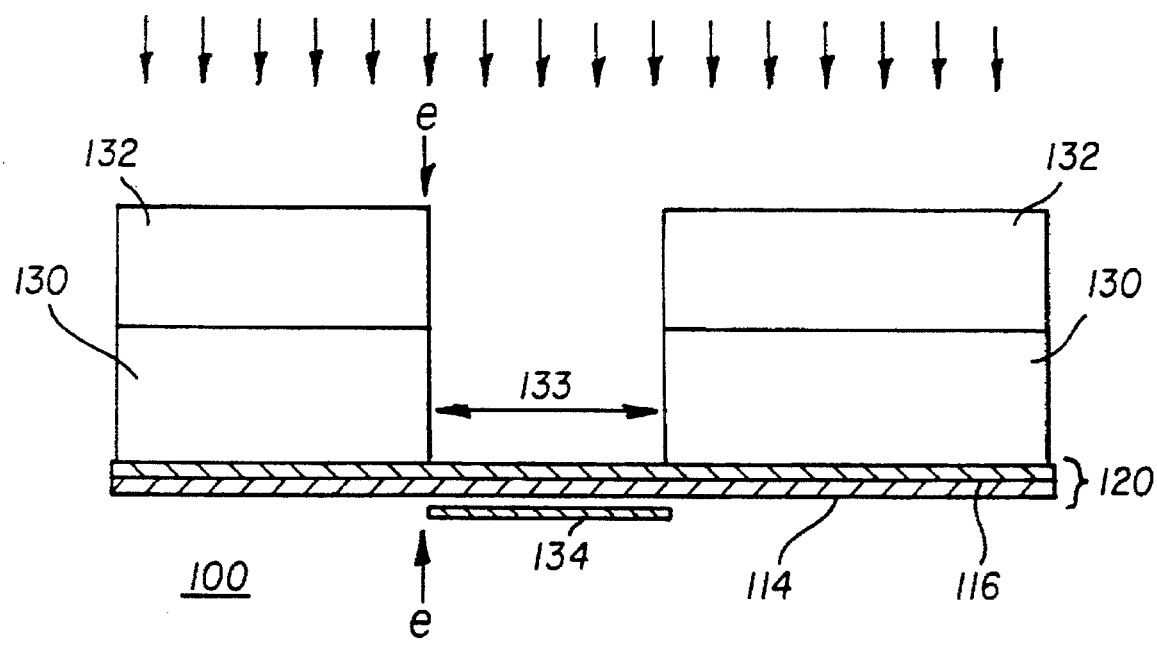
FIGS. 4A through 4F are similar to FIGS. 2A through 2K being partially schematic vertical section views through a semiconductor device illustrating the successive steps of a second embodiment of this invention.

For example, the invention may be advantageously applied to the situation in which a first implant is self-aligned to the edge of a second implant, the extent of which is in the direction opposite that of the first implant, either with or without the final presence of an electrode, over one or both implants, as in the case of self-alignment of photodiode and CCD structure, useful for the transfer of charge into a CCD structure and generally occurring in a direction perpendicular to the direction along the CCD. Such a preferred embodiment, illustrative of the use of that aspect of the current invention relating to the alignment of two or more implants, the opposite edges of which are desired to be established automatically in a state of alignment, either with or without the presence of a gate electrode, may be understood by reference to FIGS. 4A though 4F. A substrate region 100 of a first conductivity type in a semiconductor substrate is shown in FIG. 4A. Preferably, the material is P type single crystal silicon. Overlying substrate region 100 is dielectric layer 120, composed of one or more dielectric layers, the layers preferred in this embodiment being a thermally grown oxide layer, 114 and a nitride layer, 116, which may be grown, for example by high temperature nitrization in the presence of ammonia or nitrous oxide gas, as is well know in the silicon semiconductor art, or which may be deposited. Preferred thicknesses lie in the range 100 to 300 Angstroms for each layer except that the thermally grown nitride layer is preferable less than 100 Angstroms thick. A patterned sacrificial layer 130, here preferably deposited oxide, overlies portions of dielectric layer 120 except in open regions 133 where it has been removed. The patterning of this layer is accomplished by conventional lithography, using photoresist layer 132, followed by anisotropic dry etching, such as reactive ion etching, used in the art to achieve nearly vertical sidewalls. The thickness of this layer is chosen to be sufficient to block subsequent ion implantation otherwise directed into the substrate. Typical thicknesses lie in the range of from 0.2 to 2.0 microns, here preferable 0.5 microns. Also shown in FIG. 4A are the results of uniform ion implantation of a species of a first conductivity type, here Boron, which has been implanted into the substrate into region 134 in a manner self-aligned to the sidewalls of sacrificial layer 130. In particular, the implant is self-aligned to the locating edge labeled "e" of the left sidewall of sacrificial layer 130. The purpose of this implant is to increase the doping in substrate 100 in region 134 in order to confine minority charge carriers laterally, as is the practice in charge coupled device technology using photodiodes.

Figure 4B:
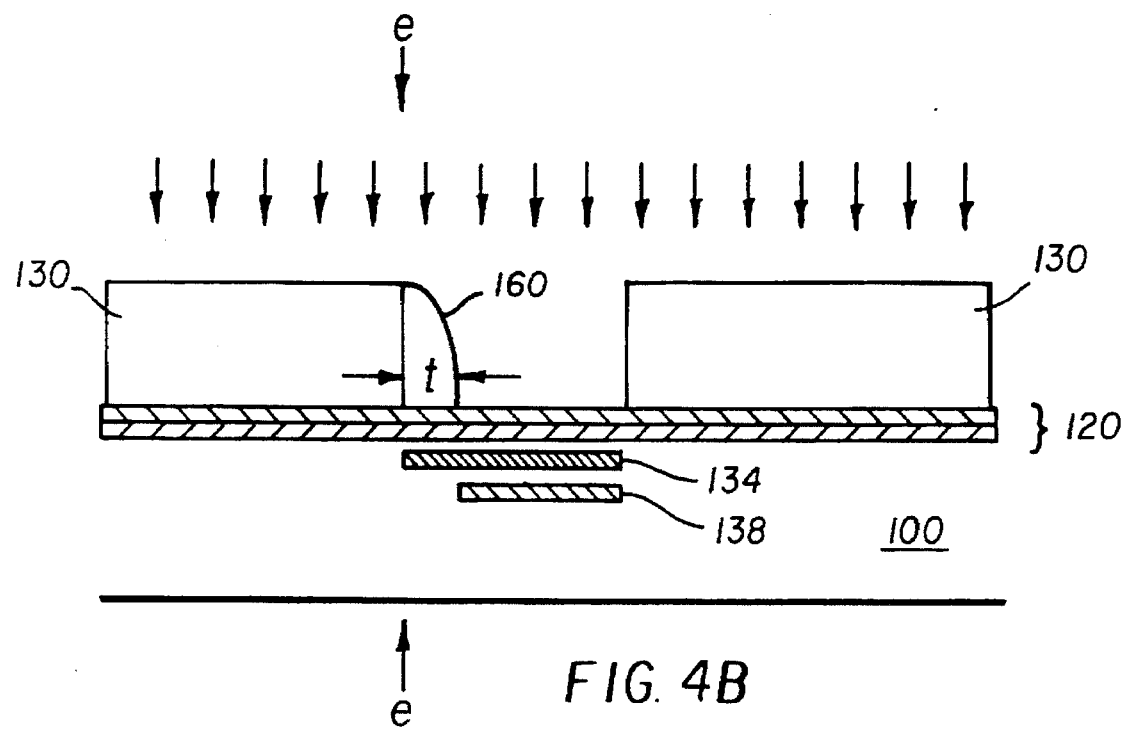

As shown in FIG. 4B, the next step in device processing restricts the portion of opening 133 available for subsequent implantation through dielectric 120 by the formation of a sidewall spacer 160 preferably of deposited oxide, the formation of which is common practice in semiconductor technology, in order to achieve a definite thickness here labeled "t", offset from locating edge "e", the left sidewall of sacrificial layer 130. This off-set is considered also self-aligned, by virtue of the fact that its width and location relative to edge "e" are not dependent an any precise mask alignment. An implant of impurity ions of the second conductivity type has been performed in FIG. 4B (arrows), resulting in formation of doped region 138 in substrate 100. In this embodiment, the implant is typically Arsenic and forms a potential well below the surface of substrate 100 in which minority charge may reside, as is well known in the art. In accordance with this invention, regions 134 and 138 are fully self-aligned to one another and to locating edge "e", and terminate abruptly, having minimal lateral spread, due to the fact that the implantations have been made only through a very thin dielectric layer. For example, the precise location between the right edge of sacrificial layer 130 and the left edge of implant 138 provides a precisely controlled barrier to laterally confine minority carriers which may be in region 138, as is know to those skilled in the art of charge coupled devices.

It is to be appreciated that restricting the portion of opening 133 immediately to the right of locating edge "e" that is available for implantation, as accomplished in the preferred embodiment by sidewall spacer 160, which blocks implantation, may also be accomplished in the reverse pattern sense, so as to leave only that portion of region 133 immediately to the right of locating edge "e" available for implantation rather than blocked from implantation. For example, this may be accomplished by patterning photoresist to remain generally above the region shown as 138 in FIG. 4B. In this case, the implant would typically be Boron and would also act to form a barrier to laterally confine minority carriers which may be in region 138, as is known in the art.

Figure 4C:
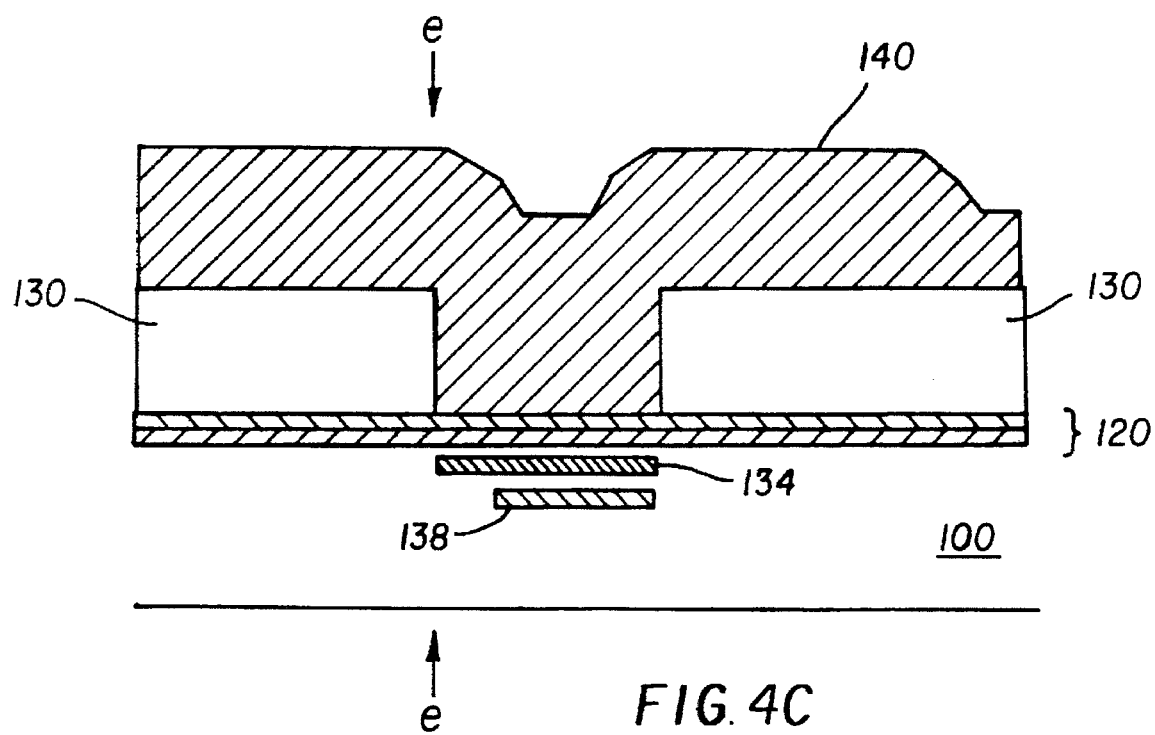
Figure 4D:
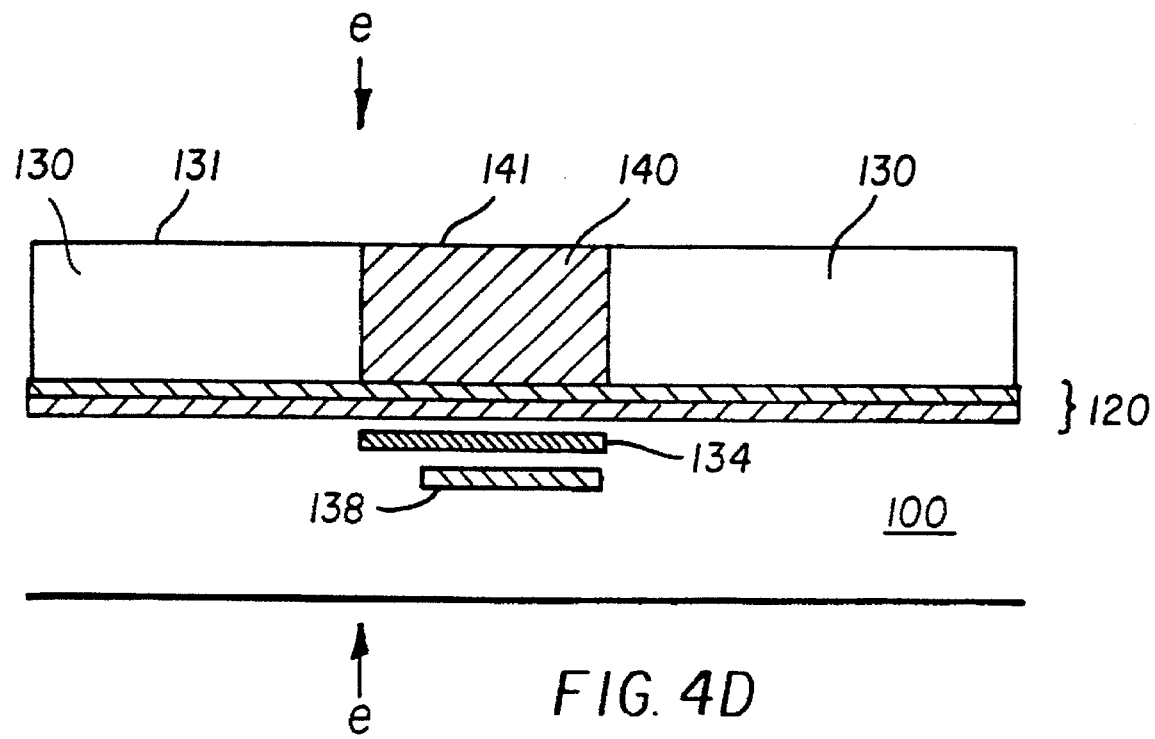

It is now desired to accurately align both a conductive electrode and a third implant, again to locating edge "e", extending to the left of edge "e", in order to provide a region to and from which charge may be transferred and a control means to effect such transfer. This is accomplished in a manner similar to the steps discussed in association with FIGS. 2E through 2G. FIG. 4C shows uniformly deposited conductive electrode layer 140, here preferably phosphorous doped polysilicon in the thickness range of from 0.2 to 2.0 microns, and preferable at least of a thickness greater that of sacrificial layer 130. As in the discussion of FIG. 2F, it is desired to planarize this layer in order to remove it entirely from sacrificial layer 130 and thereby to establish a vertical edge of the conductive electrode material in contact with the vertical sidewalls of sacrificial layer 130 and having no overlying or re-entrant profile above this sidewall which would interfere with the alignment of subsequent ion implantations. The planarization technique preferred in this embodiment is chemical mechanical polishing, as discussed in association with FIG. 2F. The profile of the resulting structure is depicted in FIG. 4D, shown before removal of sacrificial layer 130, and in FIG. 4E, shown after removal of sacrificial layer 130.

Figure 4E:
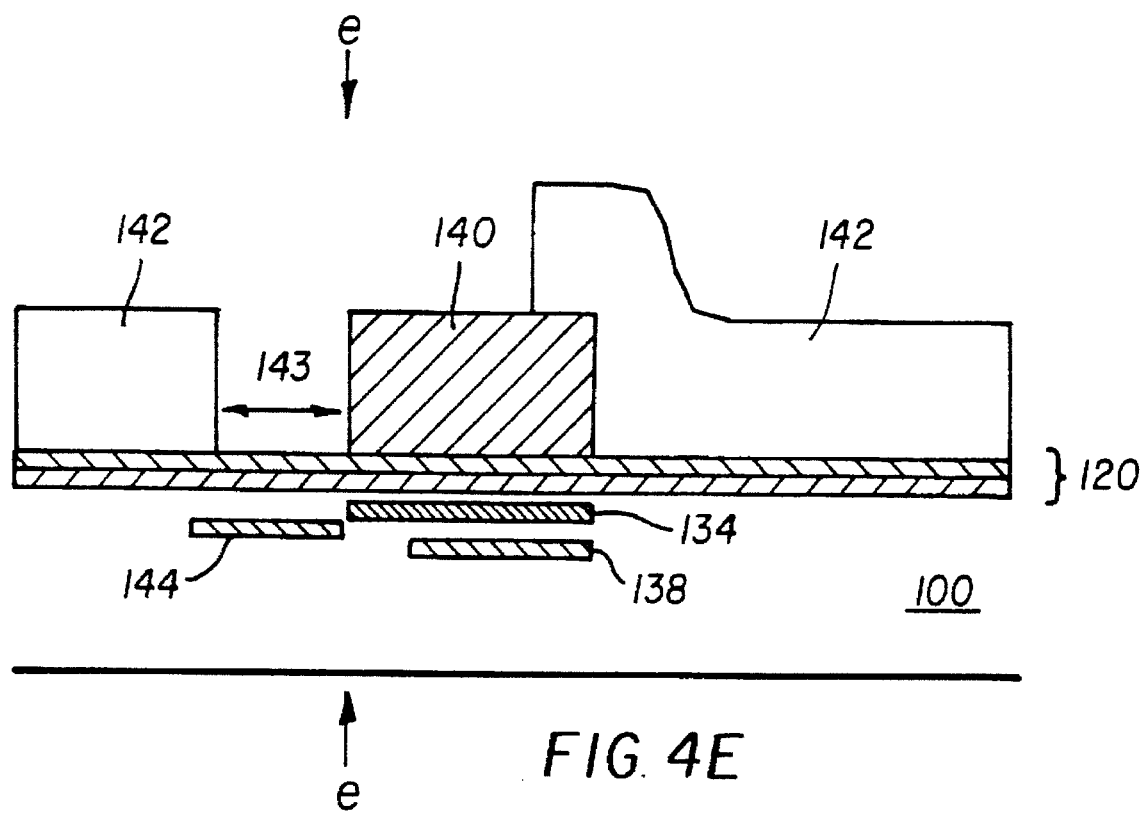
Figure 4F:
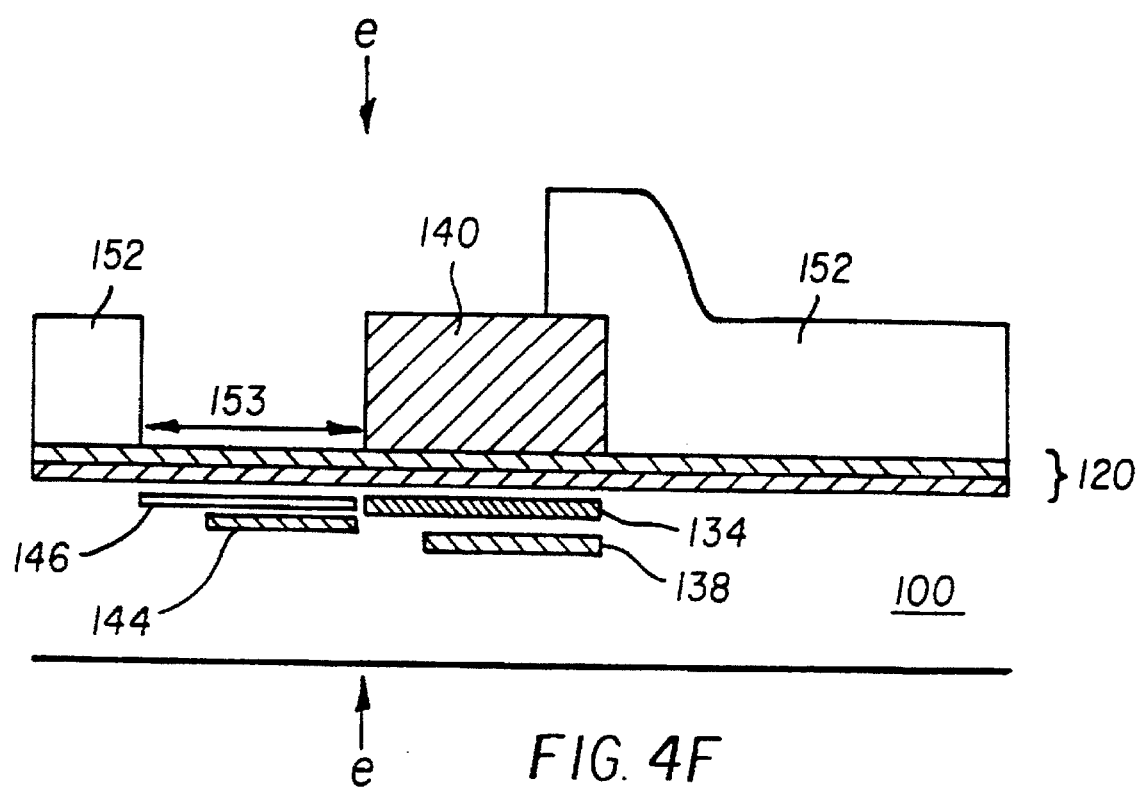

In contrast to the structure discussed in the previous embodiment, it is now desired to form a self-aligned implant or implants (in this case two implants) aligned also to locating edge "e", extending to the left of edge "e", the method by which this is done being illustrate in FIG. 4E, which depicts ion implantation into open region 143 defined by photoresist layer 142 and conductive electrode 140. In this case, implant 144 is of the second conductivity type in order to form a region, for example a photo diode region, in the vicinity of region 144, capable of holding minority charge, as in the case of region 138. Referring now to FIG. 4F, it is also desired to form a second implant 146 very near the surface of substrate 100 of impurities of the first conductivity type aligned to and extend to the left of edge "e" to form a shallow layer of majority carriers which controls or pins the surface potential of region 153 to be the potential of the substrate 100, as is common practice in the formation of photo diodes. This is accomplished in FIG. 4F by first removing photoresist 142, FIG. 4E, and then patterning photoresist 152 to expose opening 153 as shown for implantation.

Figure 5A:
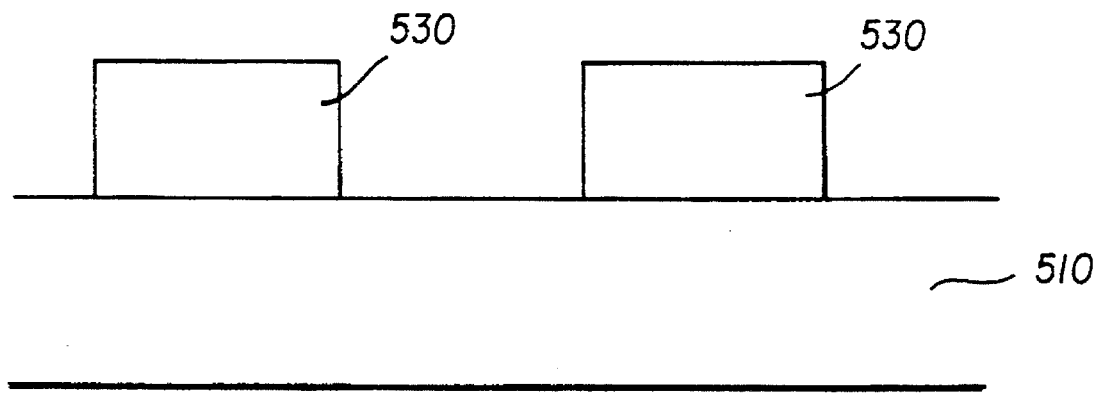
FIGS. 5A through 5D are partial schematic vertical sectional views illustrating successive steps in another embodiment of this invention.
Figure 5B:
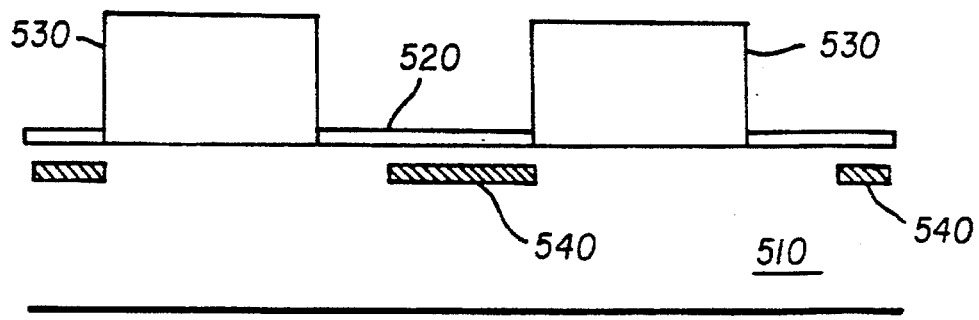
Figure 5C:
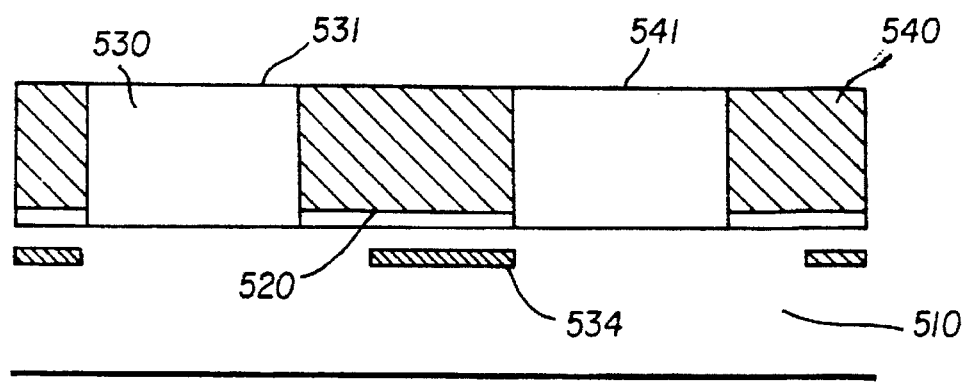
Figure 5D:
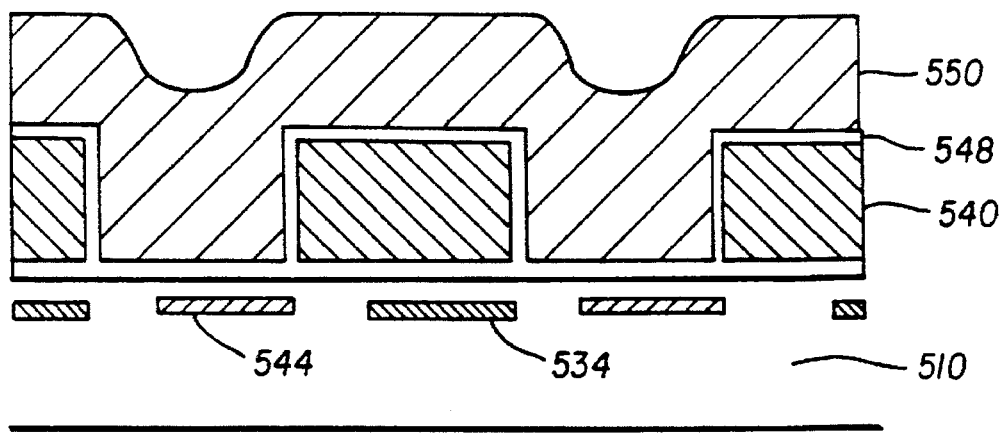

Another preferred embodiment, is shown in FIGS. 5A to 5D. In this embodiment, the sacrificial layer 530 of FIG. 5A, preferably oxide, which plays a role similar to sacrificial layer 30 of FIG. 2B, is deposited directly on single crystal semiconductive substrate 510. After implantations 534, accomplished as taught in the discussion associated with FIGS. 2C and 2D, oxide dielectric layer 520 is grown on semiconductive substrate 510, preferably by thermal oxidation, as shown in FIG. 5B, in which a distinction has been made schematically between grown oxide 520 and sacrificial oxide 530 for clarity. Subsequent to thermal oxidation, first conductive layer 540, preferably doped polysilicon, is deposited uniformly over the structure, similar to first conductive layer 40 in FIG. 2E. In FIG. 5C, first conductive layer 540 is shown rendered planar to sacrificial layer 530, accomplished preferable by chemical mechanical polishing, thus defining alternating strips of conductive layer 540 and sacrificial layer 530 with surfaces 541 and 531 respectively, as in the discussion of FIGS. 2F and 2G. The process now proceeds using essentially identical steps to those described in the first preferred embodiment, namely removal of sacrificial layer 530, preferably by dry etching, implantation of regions 544 and growth of isolation oxide 548, analogous to implanted regions 44 and oxide layer 48 of FIG. 2J. In the present embodiment, removal of sacrificial layer 530 exposed semiconductive substrate 510, there being no dielectric material underlying layer 530. There, the growth of oxide layer 548, preferably by thermal oxidation, also causes formation of thermal oxide in those regions from which sacrificial layer 530 was removed. This oxide is shown in FIG. 5D as a continuation of the oxide grown on the first conductive electrode layer 540 and is not distinguished schematically from the oxide 520 previously grown under first conductive layer 540. It will be appreciated by those knowledgeable in the art, that oxide layer 548 will now serve to electrically isolate the strips of conductive electrode material from the substrate and from subsequent second conductive electrode material (not shown) which will be deposited to form the second phase electrodes, precisely in the manner discussed in associations with FIGS. 2H to 2K of the first preferred embodiment. It will also be appreciated that the current embodiment is advantageous in that formation of dielectric layer 20 is not required and in that implants 534 and 544 are performed directly into semiconductive substrate 510 without the necessity of penetrating additional material layers.

It is to be appreciated that although the structure discussed resembles a virtual phase CCD, such as that taught by U.S. Pat. Nos. 4,047,215 and 4,229,752, in those cases the effects of misalignments are rendered small by virtue of the overwhelmingly large concentration of the pinning implant in comparison with that of the implants that lie principally under the conductive electrode. In accordance with the present invention, misalignments themselves of implants 144, 134, and 138 are rendered small by self-alignment of the masks involved in their creation, providing a different and more favorable distribution of impurities that facilitates charge transfer between regions 144 and 138 without relying on implantation at one process step overwhelming the effects of implantation at a later step.

The invention may also be advantageously applied to other CCD structures, including a virtual phase CCD and CCDs of more than two phases, for in all cases the ability to self align implants with small lateral spread to gate electrode structures is of benefit. To form a virtual phase CCD, it remains only, after the steps depicted in FIG. 2I, to provide a shallow implant of dopants of the first conductivity type between the strips of first conductive electrodes, regions 43. Thus the electrode in this embodiment is effectively the shallow implanted region, the second conductive electrode material being optional as is well known in the art. As is conventional in the formation of virtual phase CCDs, a dose in the range of from 10E12 to 10E13 implanted at from 10 to 50 KeV energy is adequate to fix or pin the surface potential in region 43 to the value of the potential in the substrate. Because there is no misalignment of the storage implant under the first conductive electrode, the pinning implant dose may be somewhat reduced, as it need not compensate such misalignment. Such a reduction in dose is advantageous in regard to the production of micro defects in the active device channel as are well known to be produced in proportion to ion implantation, even after annealing has been performed.

The invention may also be advantageously applied to CCDs of more than two phases, whenever self-alignment is essential to high charge transfer efficiency. In the case of three and four phase CCDs, the use of more than one level of implantation in a single CCD phase, while not required for charge transfer direction biasing, is useful in establishing built-in electric fields that increase the rate of charge transfer, and hence increase charge transfer efficiency for low levels of charge as taught by Erhardt in U.S. Pat. No.

4,910,569. Because many implants of varying widths may be established in accordance with this invention by repeating the steps shown in FIGS. 2C and 2D, all with one edge commonly aligned to one edge of the first conductive electrode, the built-in fields may be elaborately constructed to optimize charge transfer against other device performance parameters, such as charge storage capacity.

Another advantageous application relates to the type of charge transfer direction biasing implants used in accordance with this invention. In this preferred embodiment, the charge transfer direction biasing implant is of the first conductivity type. In this case, the charge transfer direction biasing implant acts as a CCD transfer region rather than as a storage region, which is advantageously chosen to be shorter than the remaining portion of the electrode phase. Essentially no other changes in the process are required. It is thus a feature of this technology that implantation in either storage or transfer regions is equally accommodated and that by repeating the masking and implantation steps of FIGS. 2C and 2H, all combination of self-aligned transfer and storage implants are possible. It is to be appreciated that if the conductivity type of the original substrate is reversed, an equivalent device may be formed by reversing the type of all impurity dopants, as is well known in the art.

The invention has been described in detail with particular reference to preferred embodiments thereof, but it will be understood that variations and modifications can be effected with the spirit and scope of the invention.

Parts List 10 region
10 substrate
14 first insulative layer
16 second insulative layer
20 dielectric
20 dielectric layer
30 sacrificial layer
30 layer
32 photoresist layer
33 region
34 biasing implant
34 implant
34 location
40 electrode layer
40 conductive electrodes
40 conductive layer
40 layer
41 surface
42 resist
42 photoresist layer
43 open region
43 region
44 biasing implant
48 isolation layer
50 electrode layer
60 substrate
62 oxide layer
64 nitride layer
66 oxide layer
68 nitride layer
70 dielectric material layer
100 substrate region
100 substrate
114 oxide layer
116 nitride layer
120 dielectric layer
130 sacrificial layer
132 photoresist layer
133 opening
134 region
138 region
138 doped region
140 electrode layer
142 photoresist layer
142 photoresist
143 open region
144 implant
144 regions
146 second implant
152 photoresist
153 region
160 sidewall spacer
510 substrate
520 dielectric layer
530 sacrificial layer
531 surface
534 implants
540 first conductive layer
541 surface
544 implants
548 isolation oxide

What is claimed is:

1. A CCD device made by an improved method, comprising the steps of:
   (a) providing an implant blocking insulative sacrificial layer with patterned openings directly on and exposing a dielectric layer directly on a substrate, such dielectric layer including at least two separate layers;
   (b) implanting impurity ions through the openings and the dielectric layer into the substrate;
   (c) depositing conductive electrode material in the openings and forming a first set of electrodes; and
   (d) removing the sacrificial layer and implanting additional impurity ions into the substrate through the dielectric layer using the first set of electrodes as a mask.

2. The CCD device made in accordance with the method of claim 1, further including the step of:
   (e) forming an insulative layer over the first set of electrodes; and
   (f) forming a second set of electrodes on the insulative layer spaced from the first set of electrodes and on the dielectric layer in regions from which the sacrificial layer was removed.

3. The CCD device made in accordance with the method of claim 2, further wherein the first and second sets of electrodes are coplanar.

4. The method of claim 3 wherein the first and second sets of electrodes are made coplanar by chemical mechanical polishing.

5. A CCD device formed by a method of fabricating, in a first conductivity type semiconductor substrate, a two phase charge coupled device with self-aligned dopant implanted strips in the semiconductor substrate and underlying at least a first set of gate electrodes and deposited prior to deposition of first or second gate electrode layers, comprising the steps of:
   (a) forming an insulative layer uniformly overlying the semiconductor substrate and implanting the layer with ions of a second conductivity type which is opposite to the first conductivity type to form a channel adjacent the insulative layer;
   (b) forming a sacrificial layer uniformly overlying the insulative layer whose thickness is selected to block ion implantation directed into the semiconductive layer;

(c) patterning the sacrificial layer by removal of the layer in spaced strips to establish a series of first gate electrodes;

(d) patterning in the form of spaced strips a photoresist layer on the sacrificial layer at least one edge of which lies on the top of the strips of the sacrificial layer and one edge of which lies in the region where the sacrificial layer has been removed;

(e) implanting impurity ions into the semiconductor substrate to form first charge transfer direction biasing implants, the impurity ions being blocked to prevent implantation in regions covered by the sacrificial layer;

(f) removing the photoresist and depositing uniformly a first conductive electrode layer;

(g) planarizing the first conductive electrode layer to the extent that those portions of the first conductive electrode layer initially residing on the sacrificial layer are entirely removed while those portions of the first conductive electrode layer residing on the insulative layer where the sacrificial layer has been removed are still substantially present, thereby patterning the first conductive electrode layer to form a first clocked phase;

(h) removing the sacrificial layer, thereby exposing the sidewalls of the first conductive electrode layer;

(i) patterning in the form of spaced strips another photoresist layer on the first conductive electrode layer at least one edge of which lies on the top of the strips of the first conductive electrode layer and one edge of which lies in the regions between the strips of the first conductive electrode layer;

(j) implanting additional impurity ions into the semiconductor substrate to define second charge transfer direction biasing implants, the impurity ions being blocked to prevent implantation by the first conductive electrode layer or the photoresist or both;

(k) establishing an insulative layer surrounding the first conductive electrode layer; and (l) depositing and patterning a second conductive electrode layer to form a second clocked phase.

6. A CCD device formed by an improved method, comprising the steps of:

(a) providing an implant blocking insulative sacrificial layer with patterned openings on a substrate;

(b) implanting impurity ions through the patterned openings into the substrate;

(c) providing a dielectric insulative material on the substrate in the patterned openings;

(d) uniformly depositing conductive electrode material in the patterned openings and on the sacrificial layer;

(e) removing the conductive electrode material from the sacrificial layer to confine it within the patterned openings to thereby form a first set of conductive electrode strips;

(f) removing the sacrificial layer; and (g) providing a second insulative layer on the substrate between the first set of conductive electrode strips and on the top and side portions of the first set of conductive electrode strips.

7. The CCD device made in accordance with the method of claim 6, further including the steps of providing an additional photoresist layer and removing the sacrificial layer and implanting impurity ions into the substrate through the dielectric insulative material using the first set of conductive electrode strips and the photoresist layer as a mask.

8. The CCD device made in accordance with the method of claim 7, further including the steps of:

(h) forming an insulative layer over the first set of conductive electrode strips; and (i) forming a second set of electrodes on the second insulative layer spaced from the first set of conductive electrode strips.

* * * * *